(12) United States Patent
Park et al.

(10) Patent No.: US 10,580,692 B1
(45) Date of Patent: Mar. 3, 2020

(54) INTEGRATION OF AIR SPACER WITH SELF-ALIGNED CONTACT IN TRANSISTOR

(71) Applicant: International Business Machines Corporation, Armonk, NY (US)

(72) Inventors: Chanro Park, Saratoga, NY (US); Ruilong Xie, Schenectady, NY (US); Julien Frougier, Albany, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/128,674

(22) Filed: Sep. 12, 2018

(51) Int. Cl.
*H01L 21/768* (2006.01)
*H01L 23/522* (2006.01)
*H01L 27/12* (2006.01)
*H01L 21/84* (2006.01)

(52) U.S. Cl.
CPC .... *H01L 21/7682* (2013.01); *H01L 21/76897* (2013.01); *H01L 21/845* (2013.01); *H01L 23/5226* (2013.01); *H01L 27/1211* (2013.01)

(58) Field of Classification Search
CPC ............. H01L 21/76897; H01L 21/845; H01L 27/1211; H01L 23/5226; H01L 21/7682
See application file for complete search history.

(56) References Cited

U.S. PATENT DOCUMENTS

| | | | |
|---|---|---|---|
| 8,637,384 B2 | 1/2014 | Ando et al. | |
| 9,117,805 B2 | 8/2015 | Niebojewski et al. | |
| 9,252,233 B2 | 2/2016 | Siao et al. | |
| 9,362,355 B1 | 6/2016 | Cheng et al. | |
| 9,484,250 B2 | 11/2016 | Leobandung | |
| 9,508,810 B1 | 11/2016 | Cheng et al. | |
| 9,508,829 B1 | 11/2016 | Cheng et al. | |
| 9,515,156 B2 | 12/2016 | Besser et al. | |
| 9,716,158 B1 | 7/2017 | Cheng et al. | |
| 9,722,043 B2 | 8/2017 | Basker et al. | |
| 9,786,737 B2 | 10/2017 | Cheng et al. | |
| 9,847,390 B1 | 12/2017 | Xie et al. | |
| 9,865,738 B2 | 1/2018 | Kim | |
| 2013/0267088 A1* | 10/2013 | Baek ................. | H01L 21/76802 438/637 |

\* cited by examiner

*Primary Examiner* — Feifei Yeung Lopez
(74) *Attorney, Agent, or Firm* — Cantor Colburn LLP; Joseph Petrokaitis

(57) ABSTRACT

A system and method of fabricating a semiconductor device include forming a series of gates, and forming a gate spacer on each side of each gate of the series of gates. The method includes forming a source region on a side of each of the gates and forming a drain region on an opposite side of each of the gates. The source region or the drain region between two adjacent ones of the gates is shared and only the source region or the drain region on one side of a first gate and the source region or the drain region on one side of a last gate in the series of gates are unshared source or drain regions. A self-aligned contact (SAC) is formed on the unshared source or drain regions. An air spacer is formed between the SACs and the first gate and the last gate.

20 Claims, 14 Drawing Sheets

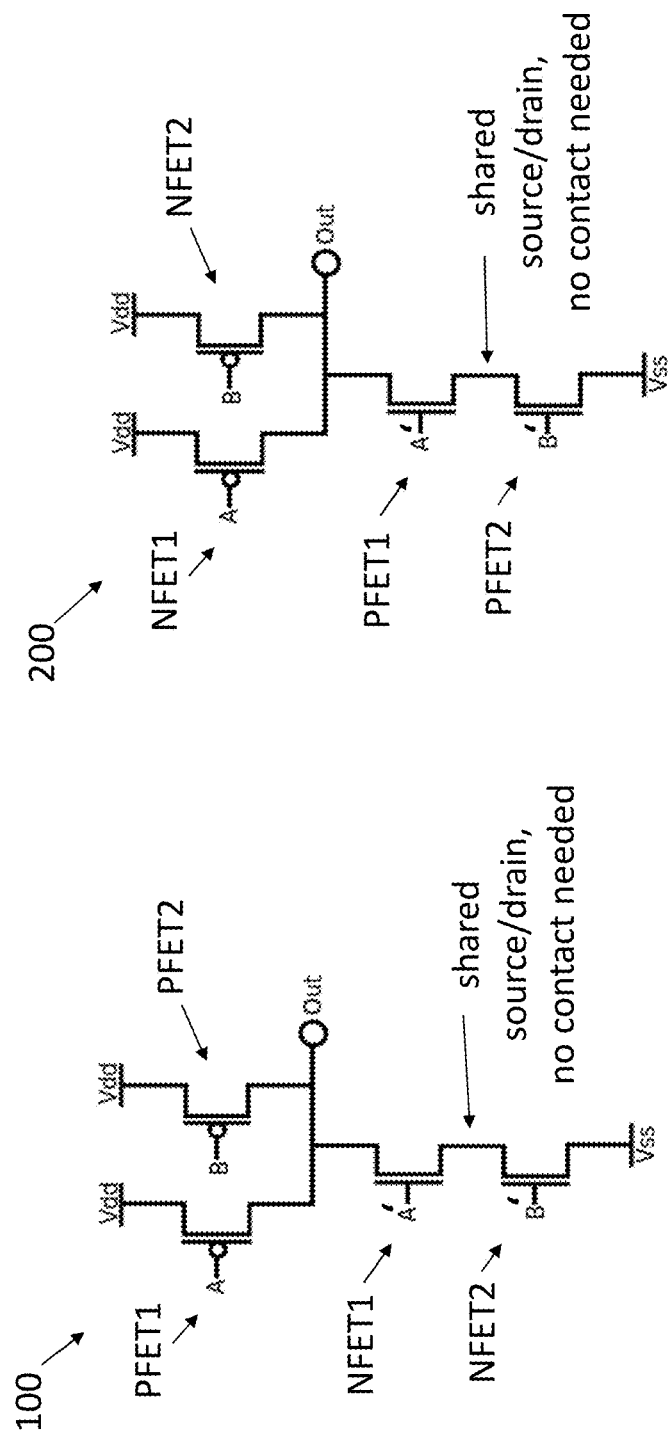

INTEGRATION OF AIR SPACER WITH SELF-ALIGNED CONTACT IN TRANSISTOR

BACKGROUND

The present invention relates to a semiconductor device, and more specifically, to integration of an air spacer with a self-aligned contact in a transistor.

In the continuing effort to decrease the size of transistors, gate pitch is decreasing along with gate size. That is, the distance between the gate and a contact above a source or drain region is smaller. This has led to the formation of a self-aligned contact (SAC). By recessing the gate metal and forming an etch stop or SAC cap above the gate, an etch of the trench that defines the contact can be allowed to self-align without a danger that the contact will connect to the gate metal. In certain devices, not every source and drain region requires a contact. For example, in a not-and (NAND) circuit, n-type field effect transistors (NFETs) are electrically connected in series by shared source and drain regions. In this type of device, forming a contact on internally connected sources and drains is not necessary. The same is true for a not-or (NOR) circuit.

SUMMARY

Embodiments of the present invention are directed to a method of fabricating a semiconductor device includes forming a series of two or more gates, and forming a gate spacer on each side of each gate of the series of two or more gates. The method also includes forming a source region on a side of each of the two or more gates and forming a drain region on an opposite side of each of the two or more gates. The source region or the drain region between two adjacent ones of the two or more gates is shared by the two adjacent ones of the two or more gates and only the source region or the drain region on one side of a first gate in the series of two or more gates and the source region or the drain region on one side of a last gate in the series of two or more gates are unshared source or drain regions. An interlayer dielectric (ILD) layer is deposited above each of the source regions and each of the drain regions, and the ILD layer is removed above the unshared source or drain regions. The method also includes removing the gate spacer on the one side of the first gate in the series of two or more gates and removing the gate spacer on the one side of the last gate in the series of two or more gates, and forming a self-aligned contact (SAC) on the unshared source or drain regions while retaining the ILD layer above all other ones of the source regions and the drain regions. An air spacer is formed between the SAC on the one side of the first gate and the first gate and between the SAC on the one side of the last gate and the last gate.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

FIGS. 1-3 show devices that are fabricated with integration of an air spacer with a self-aligned contact according to one or more embodiments of the invention, in which:

FIG. 1 is a circuit diagram of a two-input not-and (NAND) device;

FIG. 2 is a circuit diagram of a two-input not-or (NOR) device; and

FIG. 3 is a circuit diagram of a three-input NAND device;

FIGS. 4-12 show aspects of a process flow of fabricating a semiconductor device that include integration of an air spacer with self-aligned contacts (SACs) according to one or more embodiments of the invention, in which:

FIG. 4 is a cross-sectional view of a structure that results after formation of a SAC cap over a recessed gate 445 in three nanosheet field effect transistors (FETs);

FIG. 5 shows the structure that results from formation of trenches above unshared source or drain regions;

FIG. 6 shows a structure that results from removal of the low-k spacers exposed in the structure shown in FIG. 5;

FIG. 7 shows the structure that results from the deposition of liners;

FIG. 8 shows the structure that results from removal of the sacrificial spacer material on horizontal surfaces of the structure shown in FIG. 7;

FIG. 9 shows the result of forming SACs;

FIG. 10 shows the structure that results from recessing the SACs;

FIG. 11 shows the structure that results from removing the sacrificial spacer material; and FIG. 12 shows the air spacers between each SAC and adjacent gate;

DETAILED DESCRIPTION

Figure 3:
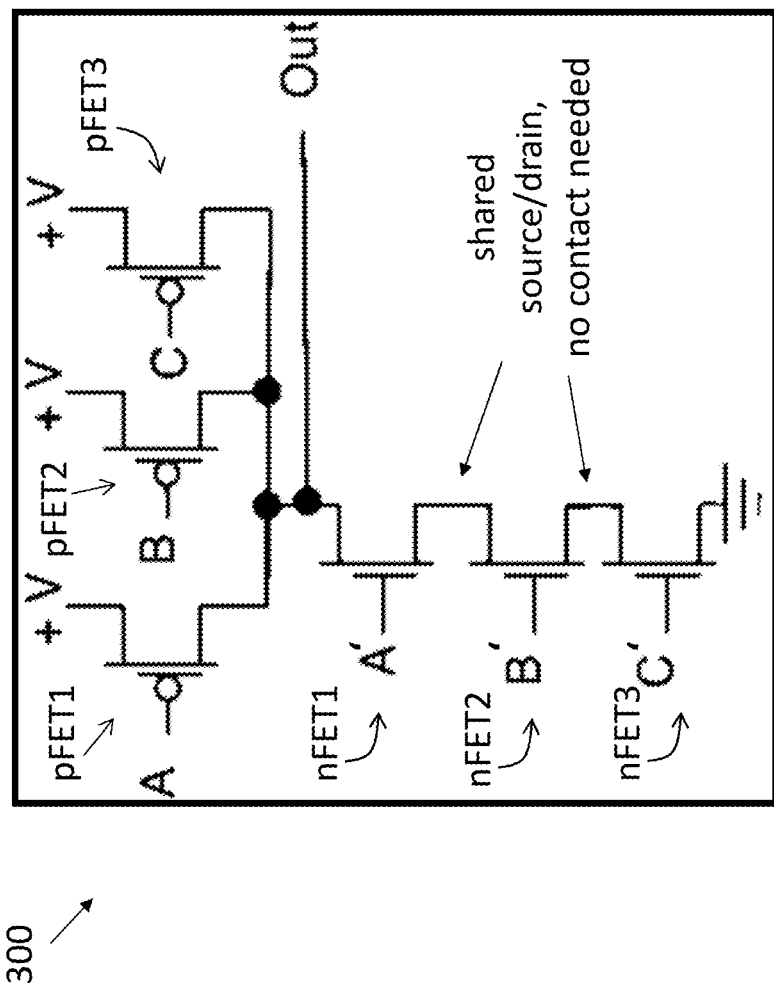

It is understood in advance that although this invention includes a detailed description of exemplary gate-all-around (GAA) nanosheet FET architectures having silicon (Si) channel nanosheets and SiGe sacrificial nanosheets, embodiments of the invention are not limited to the particular FET architectures or materials described in this specification. Rather, embodiments of the present invention are capable of being implemented in conjunction with any other type of nanosheet/nanowire FET architecture or materials now known or later developed. In this detailed description and in the claims, the terms nanosheet and nanowire are treated as being synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by incorporating n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling CMOS technology down to seven (7) nanometer node and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a particular application. Some of these challenges apply, as well, to other types of FETs (e.g., fin FETs, nanowire FETs). For example, as previously noted, some devices have transistors that are electrically connected in series by shared sources and drains. Placing contacts on the internally connected sources and drains increases parasitic capacitance between the gate and contact without any benefit. This is because self-aligned contacts address the reduction in gate pitch but increase parasitic capacitance between the source or drain contact and the metal gate. While the parasitic capacitance issue can be addressed by replacing the typical low-k dielectric spacer between the contact and the gate with an air spacer, removing the low-k spacer selective to surrounding materials such as the SAC cap is challenging.

Turning now to an overview of aspects of the invention, embodiments of the invention address the above-described shortcomings of the prior art by integrating of an air spacer with a self-aligned contact. Air spacers are formed only in the region where contacts are present. As detailed, low-k spacers damaged during an etch of the contacts are replaced with a sacrificial material (e.g., amorphous SiGe or Ge) that can easily be removed selective to contact metal and dielectric. In regions where no contact is needed, the low-k spacers remain to improve mechanical stability of the structure. While nanosheet FETs, specifically, three nanosheet transistors in a NAND circuit configuration, are used to illustrate exemplary embodiments of the invention, the processes detailed are equally applicable to other types of transistors (e.g., finFETs, nanowire FETs) and devices.

FIGS. 1-3 show devices that are fabricated with integration of an air spacer with a self-aligned contact according to one or more embodiments of the invention. FIG. 1 is a circuit diagram of a two-input NAND device 100 with two p-type FETs (pFETs), pFET1 and pFET2, and two nFETs, nFET1 and nFET2. The nFETs, nFET1 and nFET2, share a source or drain region, as indicated. This region does not require a contact. Thus, the formation of a contact and the air spacer integrated with each contact can be limited to only one side of each of the nFETs. FIG. 2 is a circuit diagram of a two-input NOR device 200 with two nFETs, nFET1 and nFET2, and two pFETs, pFET1 and pFET2. The pFETs, pFET1 and pFET2. share a source or drain region, as indicated. Thus, the formation of a contact and the air spacer integrated with each contact can be limited to only one side of each of the pFETs.

FIG. 3 is a circuit diagram of a three-input NAND circuit 300 with three p-type FETs (pFETs), pFET1, pFET2, and pFET3, and three nFETs, nFET1, nFET2, and nFET3. The nFETs, nFET1, nFET2, and nFET3, share two source and drain regions, as indicated. That is, both the source and drain regions of nFET2 are shared. These shared regions do not require a contact. Thus, the formation of a contact and the air spacer integrated with each contact can be limited to only one side of each of the nFETs, nFET1 and nFET3. The formation of source and drain contacts with integrated air spacers, according to exemplary one or more embodiments, is detailed for the three-input NAND circuit 300 with reference to FIGS. 4-12. While aspects of the fabrication of the nFETs of the three-input NAND circuit 300 are specifically detailed for explanatory purposes, the processes are not limited to any particular device or type of device. In addition, while nanosheet FETs are shown for explanatory purposes, other types of transistors can benefit from integration of an air spacer with a self-aligned contact according to one or more embodiments of the invention.

Figure 4:
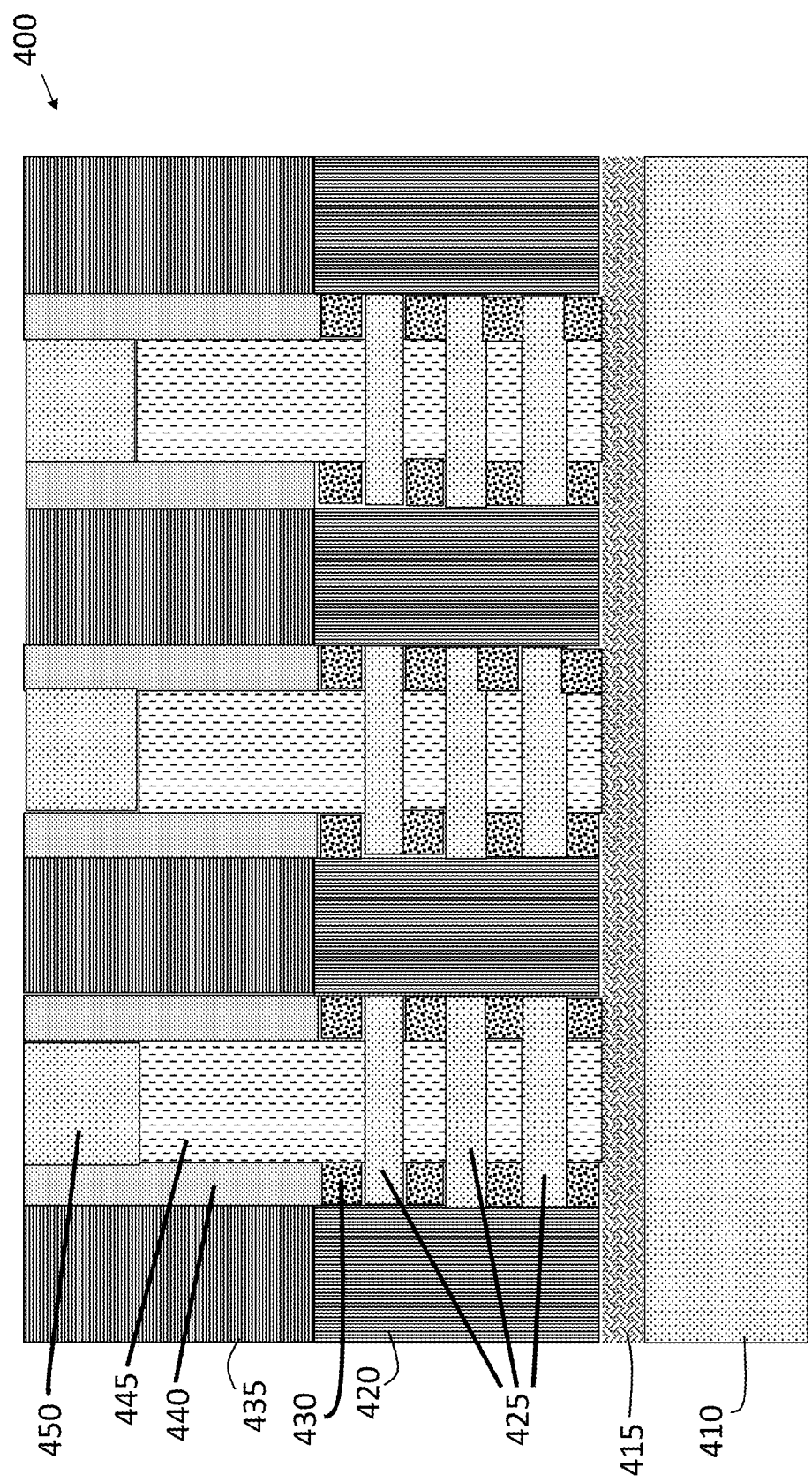

FIGS. 4-12 show aspects of a process flow of fabricating nanosheet FETs that include integration of an air spacer 1210 (FIG. 12) with self-aligned contacts 910 (FIG. 9) according to one or more embodiments of the invention. FIG. 4 is a cross-sectional view of a structure 400 that results after formation of a SAC cap 450 over a recessed metal gate 445 in three nanosheet FETs. A dielectric layer 415 is formed on a substrate 410. The dielectric layer 415 is a spacer material that isolates the source and drain regions 420 from the substrate 410. The substrate 410 can include a bulk semiconductor, such as silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates 410 include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 410 can also comprise an organic semiconductor or a layered semiconductor such as, for example, Si/SiGe, a silicon-on-insulator or a SiGe-on-insulator. A portion or entire semiconductor substrate 410 can be amorphous, polycrystalline, or monocrystalline. In addition to the aforementioned types of semiconductor substrates 410, the substrate 410 can also comprise a hybrid oriented (HOT) semiconductor substrate in which the HOT substrate has surface regions of different crystallographic orientation. The substrate 410 can be doped, undoped, or contain doped regions and undoped regions therein. The substrate 410 can contain regions with strain and regions without strain therein, or contain regions of tensile strain and compressive strain. In one or more embodiments, the substrate 410 can be a semiconductor-on-insulator (SOI) substrate. The substrate 410 can further include other structures (not shown) such as shallow trench isolation (STI), fins, nanowires, nanosheets, resistors, capacitors, etc.

As shown, three sets of nanosheets 425 are formed above the dielectric layer 415. Adjacent nanosheets 425 of each set are separated by inner spacers 430. A gate 445 is shown in the gate-all-around configuration in which the gate 445 surrounds each nanosheet 425. Each gate 445 can include a gate dielectric and a gate conductor. The gate dielectric can include any suitable dielectric material such as, for example, silicon oxide, silicon nitride, silicon oxynitride, high-k materials, or any combination of these materials. Exemplary high-k materials include metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can also include dopants such as lanthanum, aluminum, magnesium. The gate dielectric material can be formed by any suitable process or any suitable combination of multiple processes like thermal oxidation, chemical oxidation, thermal nitridation, plasma oxidation, plasma nitridation, atomic layer deposition (ALD), and chemical vapor deposition (CVD). The gate dielectric can have a thickness ranging from 1 nanometer (nm) to 5 nm, although less thickness and greater thickness are also conceived. The gate conductor can include any suitable conducting material like doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube, conductive carbon, graphene, or any suitable combination of these materials. The conductive material can also include dopants that are incorporated during or after deposition. The gate can also include a workfunction setting layer between the gate dielectric and gate conductor. The workfunction setting layer can be a workfunction metal (WFM). The WFM can be any suitable material like a nitride (e.g., titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof). A conductive material or a combination of multiple conductive materials can serve as both the gate conductor and WFM. The gate conductor and WFM can be formed by any suitable process or any suitable combination of multiple processes such as ALD, CVD, physical vapor deposition (PVD), sputtering, plating, evaporation, ion beam deposition, electron beam deposition, laser assisted deposition, and chemical solution deposition.

Figure 9:
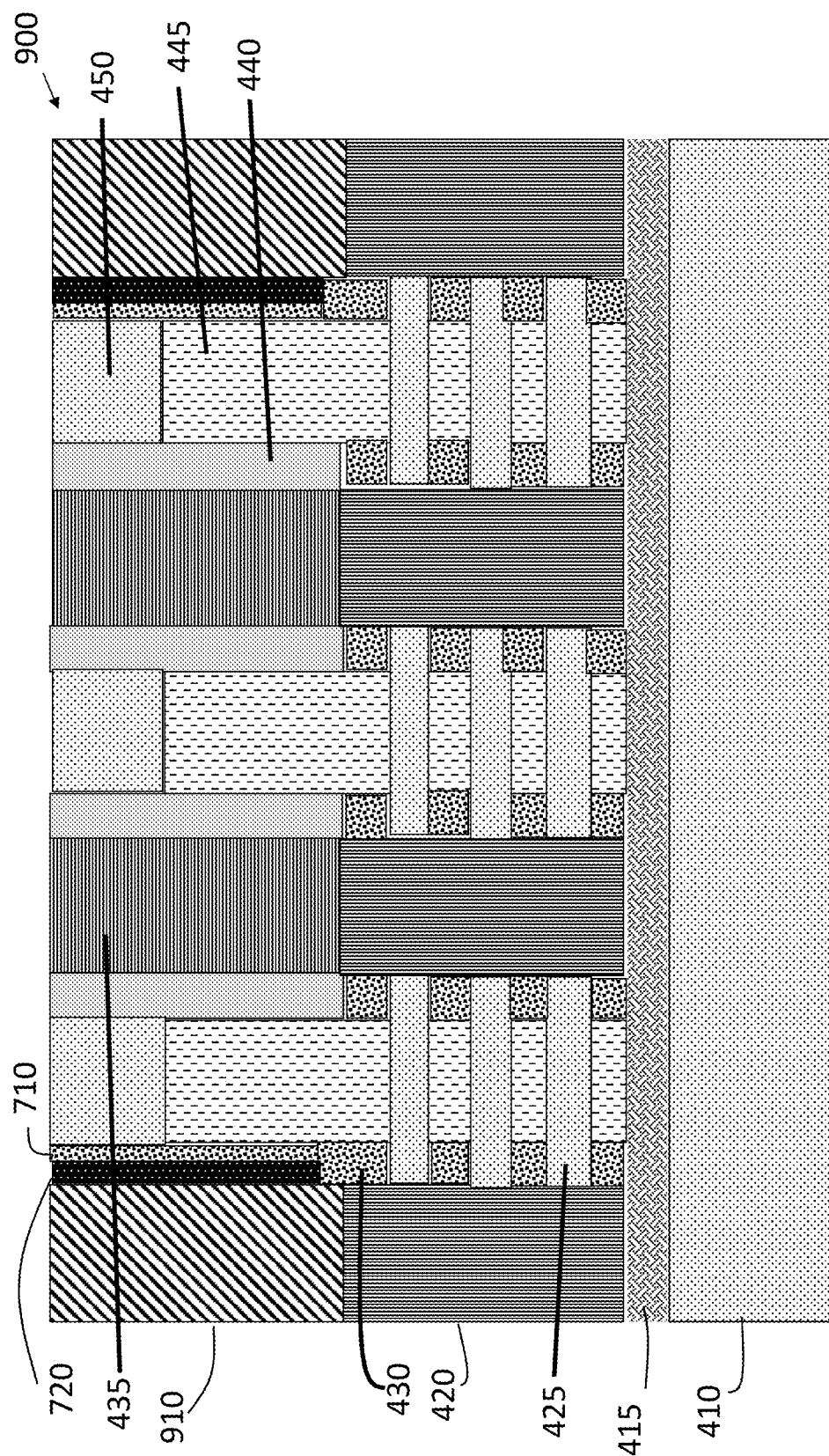
Figure 12:
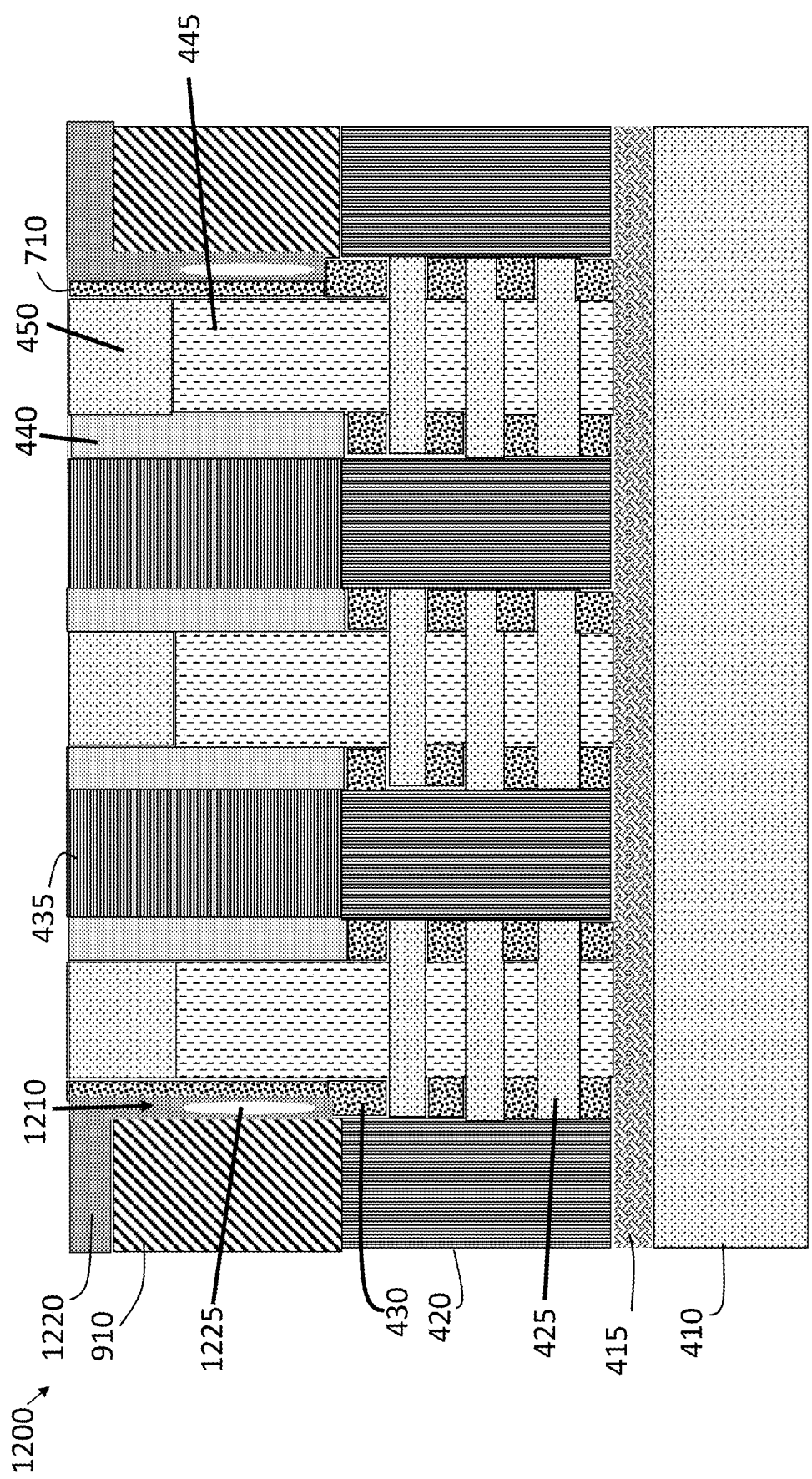

Low-k spacers 440 are formed on either side of each gate 445 above the set of nano sheets 425. Some examples of the low-k spacer material include silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, and combinations thereof. The low-k spacer material can have a dielectric constant less than about 7, less than about 5. The low-k spacers 440 can be formed by any suitable techniques such as deposition followed by directional etch. Deposition can include ALD and CVD. Directional etch can include reactive ion etch (ME). As FIG. 4 shows, two of the source and drain regions 420 are shared. Specifically, the source or drain region 420 on either side of the center set, among the three sets, of nanosheets 425 are shared. Thus, no contact is needed above these source or drain regions 420. An interlayer dielectric (ILD) layer 435 is above each source or drain region 420. As noted, only the ILD layers 435 above the source or drain regions 420 on each end of the structure 400 need to be replaced with SACs 910 (FIG. 9). As such, only the low-k spacers 440 adjacent to these ILD layers 435 on either end need to be replaced with air spacers 1210 (FIG. 12). An SAC cap 450 is formed above each gate 445.

Figure 5:
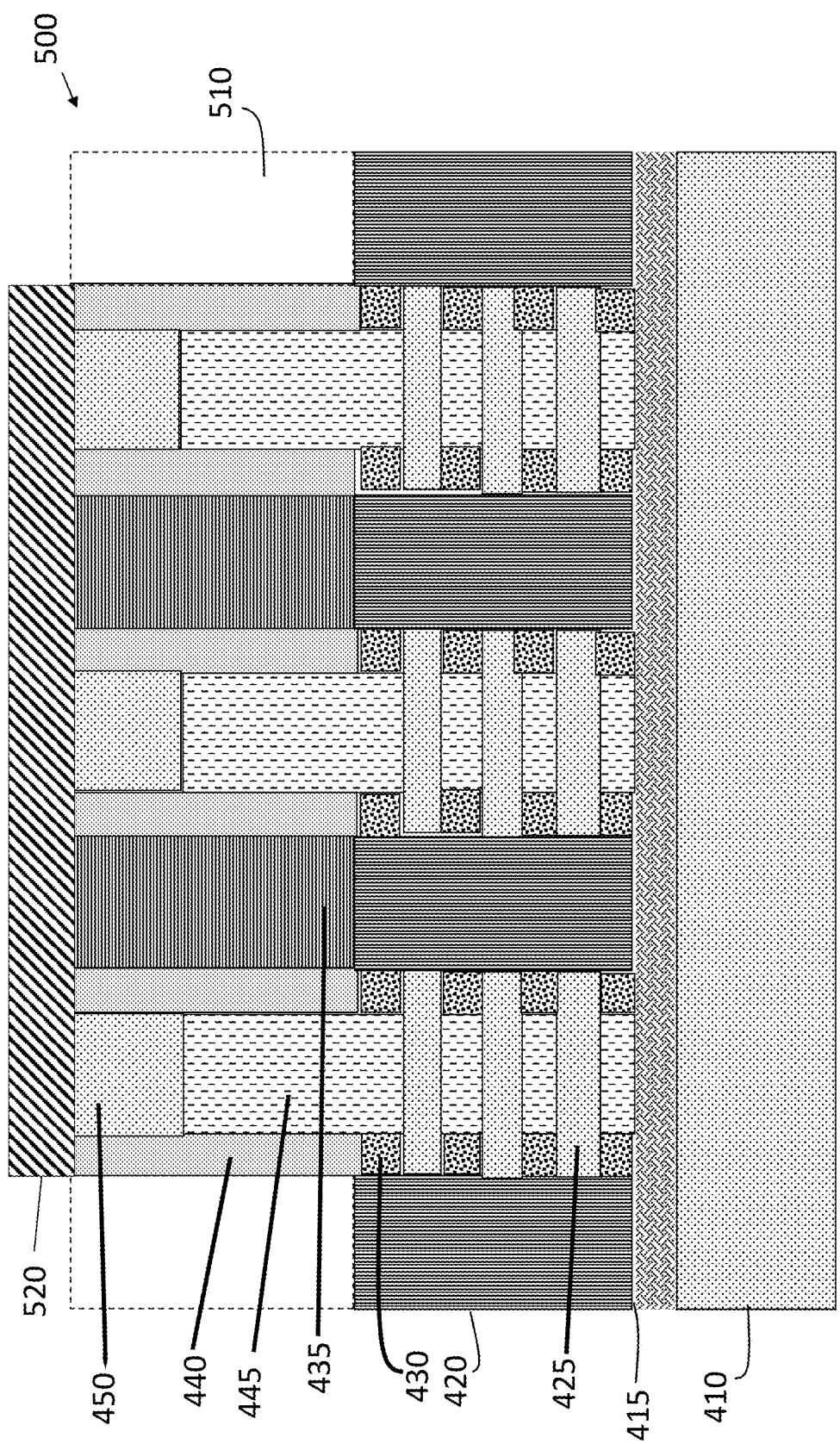

FIG. 5 shows the structure 500 that results from formation of trenches 510 above the unshared source or drain regions 420. The ILD layers 435 above those source or drain regions 420, as shown in the structure 400 of FIG. 4, are removed to form the trenches 510. A RIE process is followed by a chemical oxide removal (COR) process to remove any remaining ILD material on the sidewalls of the adjacent low-k spacers 440. A mask 520 is formed over the SAC caps 450 and low-k spacers 440 to protect those materials during the ME and COR processes. However, because the low-k spacers 440 directly adjacent to the ILD layers 435 that are removed will ultimately be replaced, damage to those low-k spacers 440 does not present issues. Thus, unlike prior process flows, the RIE process need not be carefully tuned to avoid damage to those low-k spacers 440.

Figure 6:
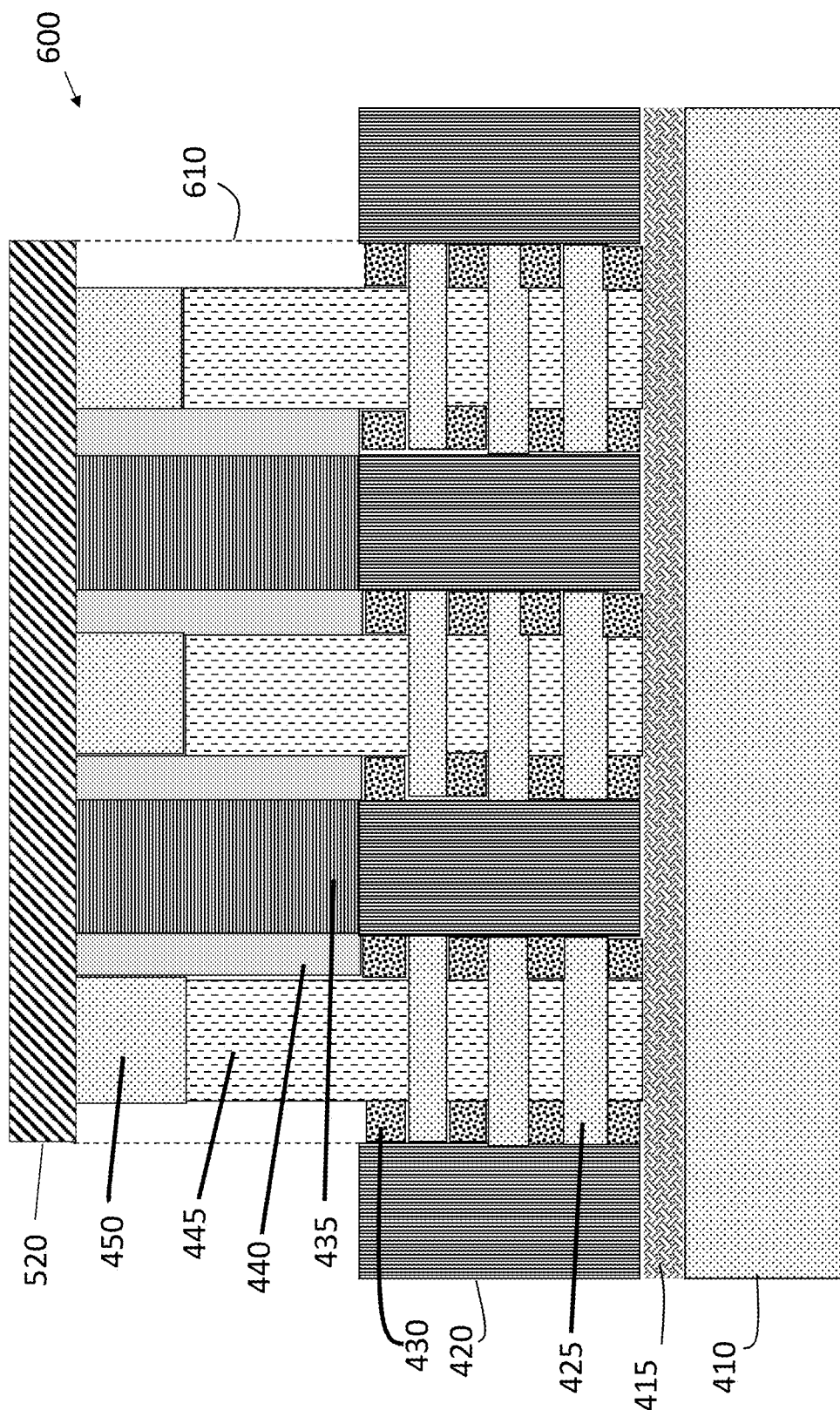
Figure 7:
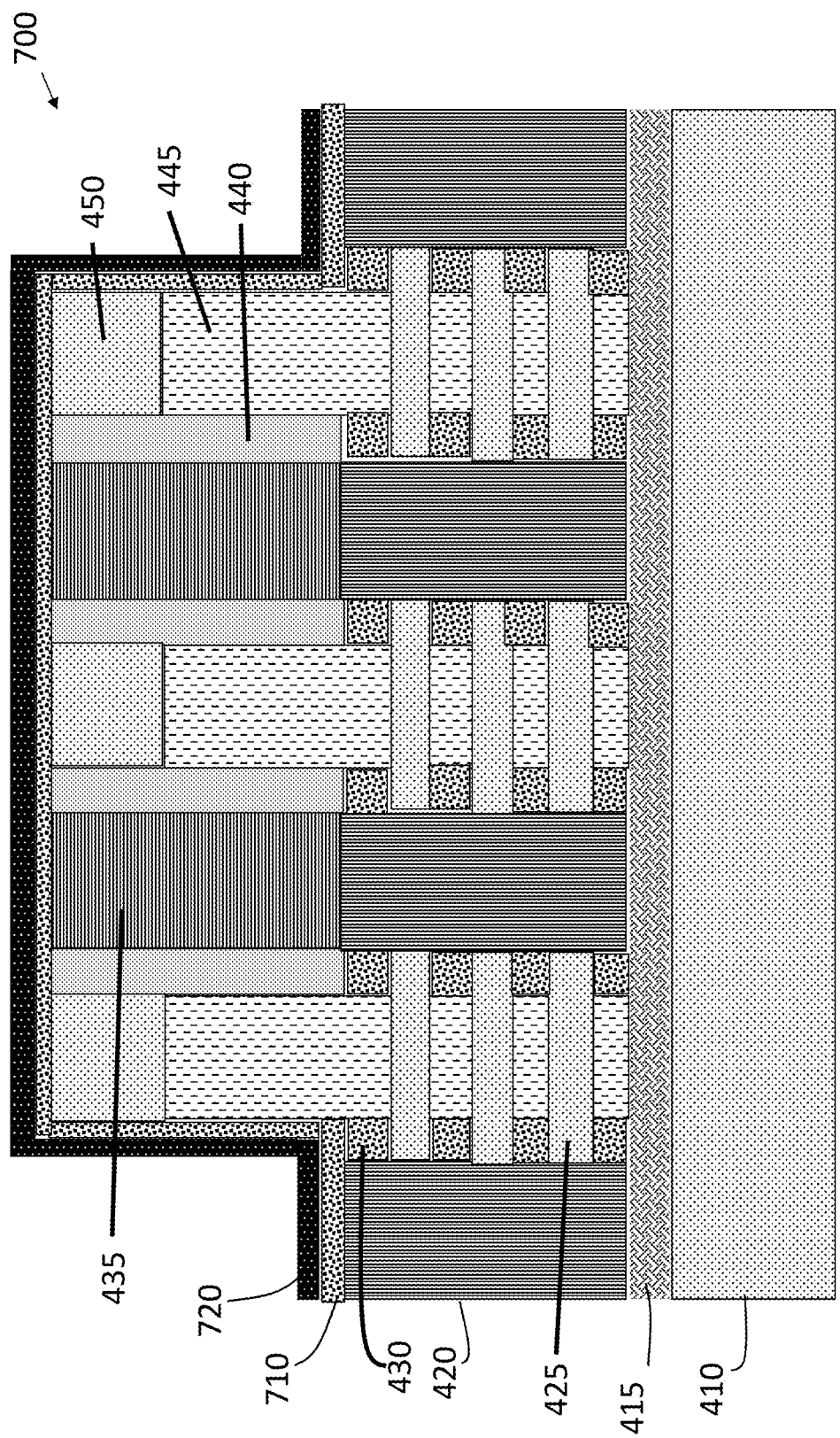

FIG. 6 shows a structure 600 that results from removal of the low-k spacers 440 exposed in the structure 500 shown in FIG. 5. An isotropic etch is performed to remove the low-k spacers 440 indicated by the dashed lines 610. FIG. 7 shows the structure 700 that results from the deposition of liners on the structure 600 shown in FIG. 6. The mask 520 is stripped from the structure 600 shown in FIG. 6. A thin liner 710 is conformally deposited. This liner 710 can be silicon nitride (SiN), for example, and can have a thickness on the order of 2 nm. A sacrificial spacer material 720 is deposited conformally deposited over the liner 710. The sacrificial spacer material 720 can be amorphous germanium (aGe), for example, and can have a thickness on the order of 5 nm.

Figure 8:
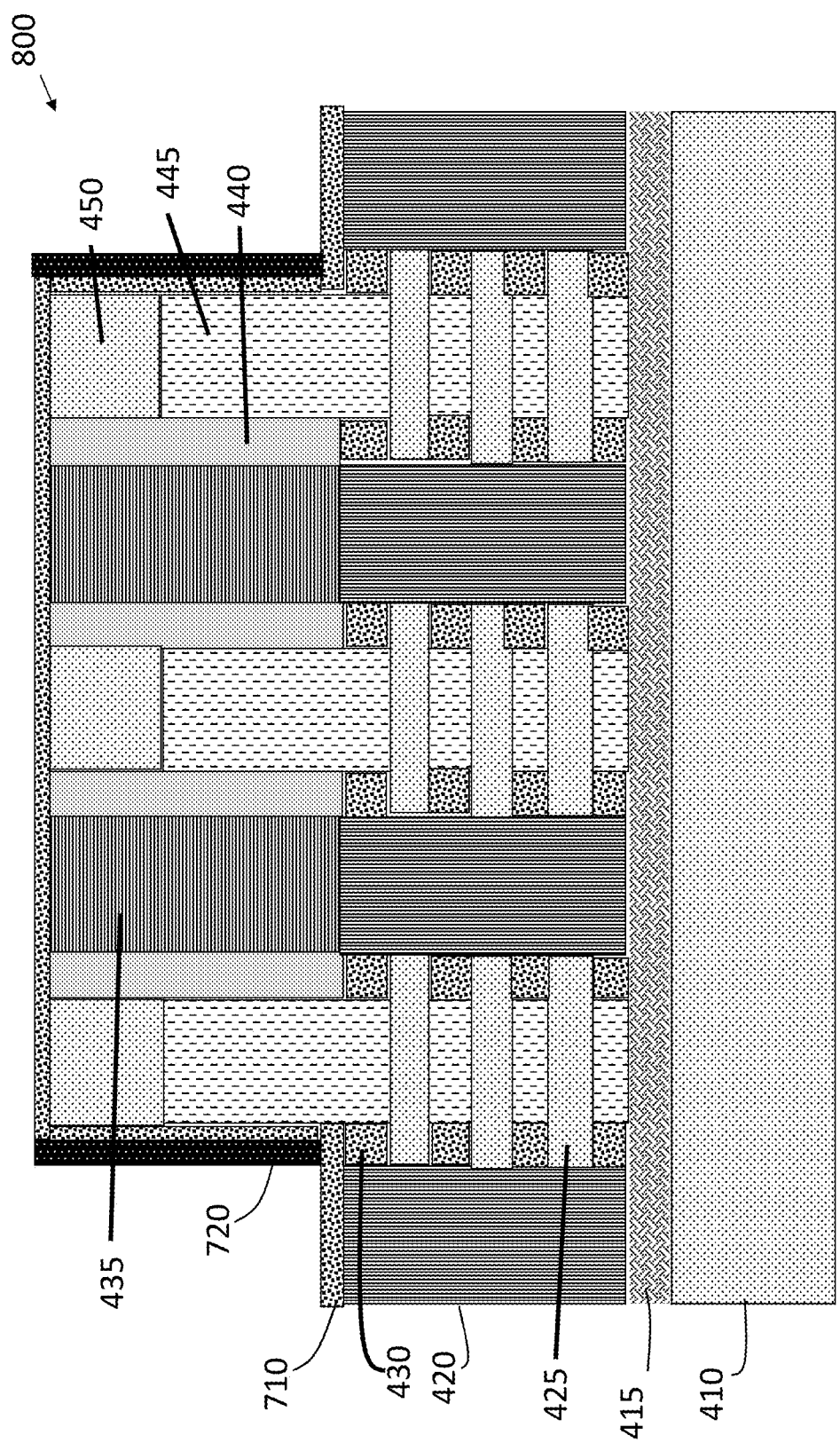

FIG. 8 shows the structure 800 that results from removal of the sacrificial spacer material 720 on horizontal surfaces of the structure 700 shown in FIG. 7. An ME process is used to remove the exposed sacrificial spacer material 720. FIG. 9 shows the structure 900 that results from formation of the SAC 910, which can also be referred to as a source or drain contact. The liner 710 on the horizontal surfaces is removed and the SACs 910 are formed adjacent to the exposed sacrificial spacer material 720. The SAC 910 is a metal (e.g., tungsten (W), aluminum (Al), copper (Cu), cobalt (Co), nickel (Ni), titanium (Ti), ruthenium (Ru), or any other suitable conductive material). The SAC 910 can further include a barrier layer. The barrier layer can be titanium nitride (TiN), tantalum nitride (TaN), hafnium nitride (HfN), niobium nitride (NbN), tungsten nitride (WN), tungsten carbon nitride (WCN), or combinations thereof. The barrier layer can prevent diffusion and/or alloying of the metal contact fill material with the top source drain material, and/or anode/cathode material. A chemical mechanical planarization (CMP) process can be performed following deposition of the metal of the SACs 910.

Figure 10:
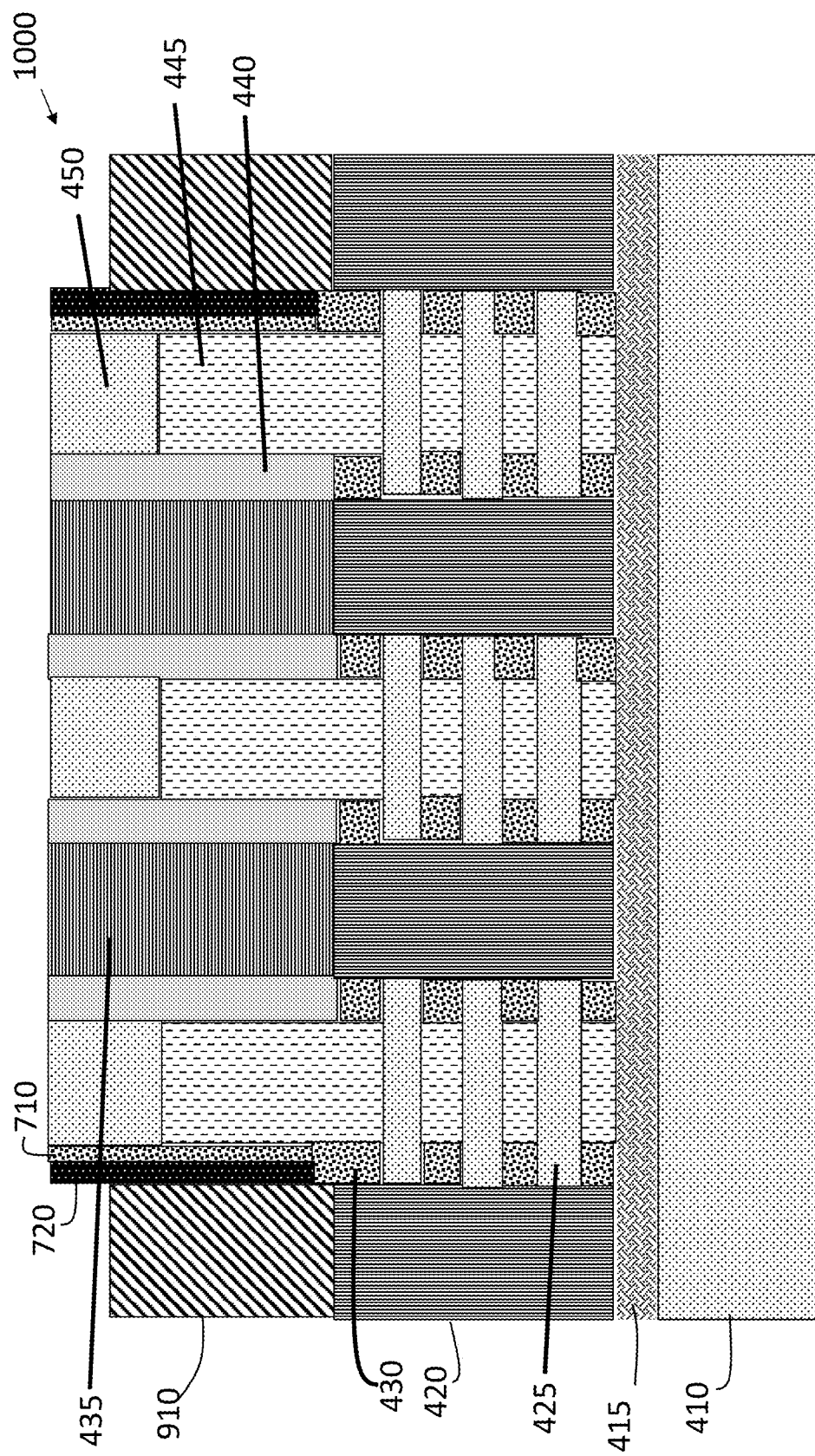
Figure 11:
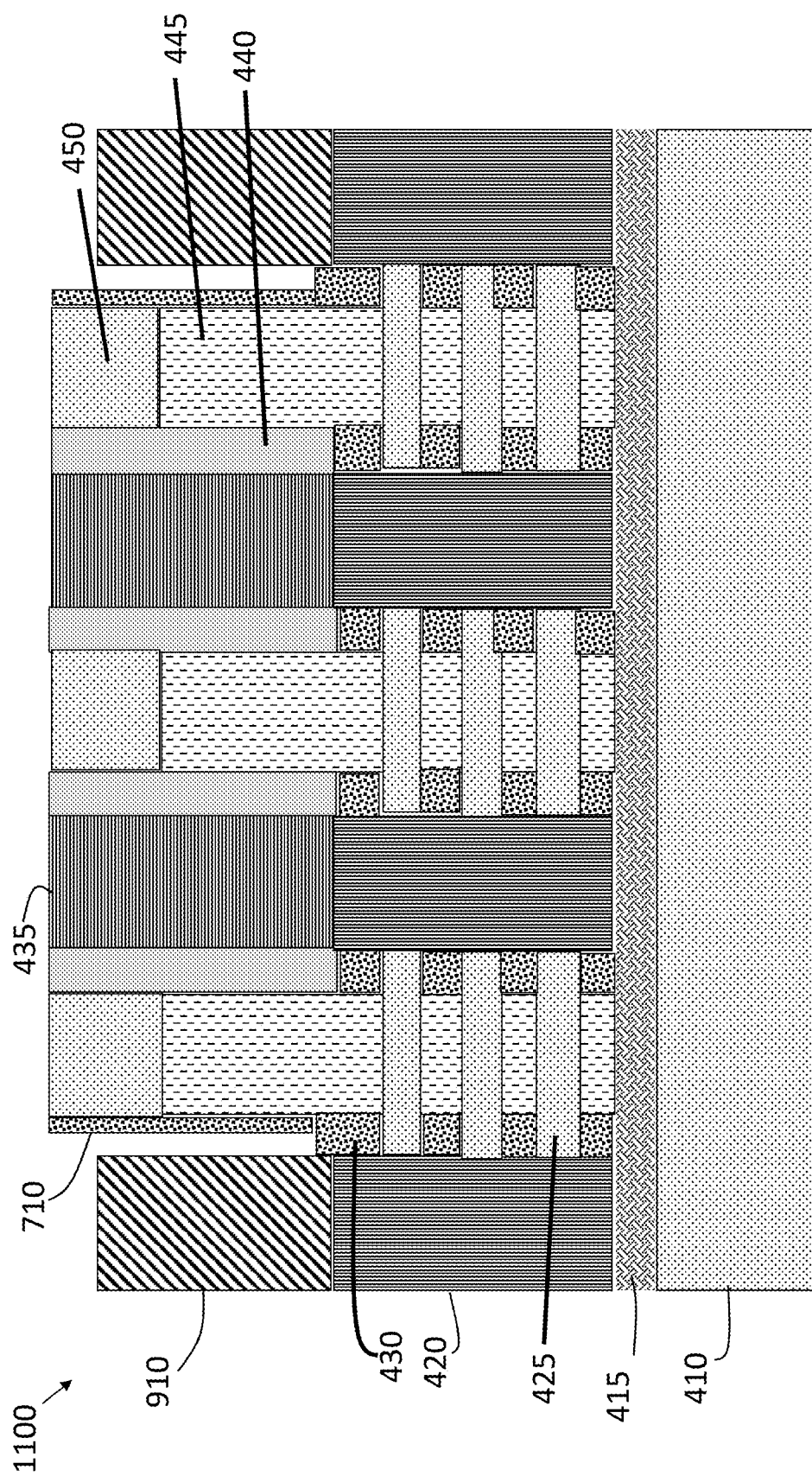

FIG. 10 shows the structure 1000 that results from recessing the SACs 910. FIG. 11 shows the structure 1100 that results from removal of the sacrificial spacer material 720. A wet etch process with a hydrogen peroxide ($H_2O_2$) solution can be used, for example, to remove an amorphous germanium sacrificial spacer material 720. This process is highly selective to dielectric and metal. The metal of the gate 445 is protected by the liner 710 that is retained. The prior approach does not involve replacing the low-k spacers 440 with sacrificial spacer material 720 in areas where air spacers 1210 (FIG. 12) are to be formed. As a result, the prior approach requires an aggressive top-down RIE process to remove the low-k spacers 440, and the ME process risks damage to the metal of the gate 445. According to one or more embodiments of the invention, SACs 910 are only formed over source and drain regions 420 that are not shared and air spacers 1220 (FIG. 12) are only formed adjacent to the SACs 910. Thus, the process flow detailed herein, which does not impact the metal of the gate 445, can be used to form the air spacers 1220.

FIG. 12 shows the structure 1200 that results from forming the air spacers 1210 between each SAC 910 and adjacent gate 445. Simultaneously, a dielectric cap 1220 is formed on top of SAC 910. The different materials of the dielectric cap 1220 on top of SAC 910 and SAC cap 450 on top of gate 445 enable the formation of the gate contact 1610 (FIG. 14) and vias 1510 (FIG. 14) to the SACs 910 on the active device region. The non-conformal deposition of the dielectric cap 1220 pinches off an air gap 1225 and form the air spacer 1210. The dielectric cap 1220 can be silicon oxide nitride (SiON), for example. The size of the air gap 1225 can be controlled by tuning the conformality of the deposition process of the dielectric cap 1220. A lower conformality results in a larger air gap 1225 than a higher conformality. After removing the sacrificial spacer material 720 a laser anneal can be performed to reduce the contact resistance between the SAC 910 and the source or drain region 420 directly below.

Figure 13:
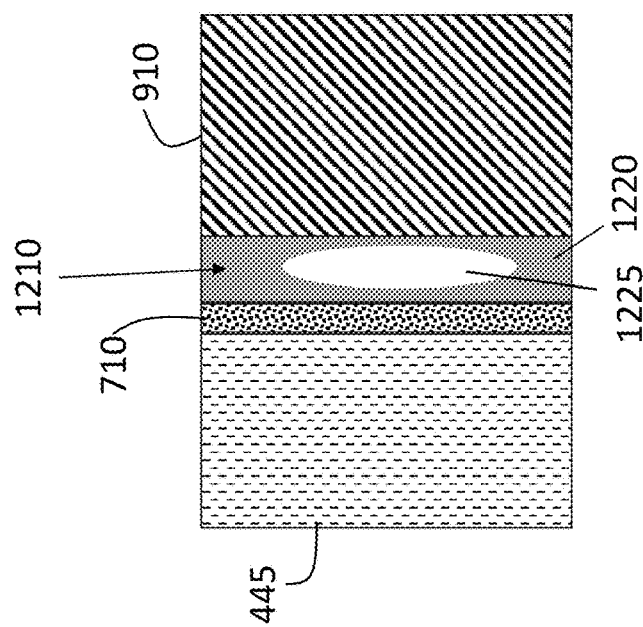
FIG. 13 shows a cross-sectional view detailing the air spacer between an SAC and gate according to one or more embodiments of the invention.

FIG. 13 shows a cross-sectional view of aspects of the structure 1200 shown in FIG. 12. An overhead cross-sectional view is shown of the right-most portion of the structure 1200. As indicated, the gate 445 (e.g., a high-k metal) is adjacent to the liner 710 (e.g., SiN). An air spacer 1210 comprised of an air gap 1225 surrounded by material of the dielectric cap 1220 (e.g., SiON) separates the liner 710 from the SAC 910. The total capacitance ($C_{total}$) between the gate 445 and the SAC 910 includes the capacitance of the liner 710 ($C_{liner}$), the capacitance of the air gap 1225 ($C_{air}$), and the capacitance of the material of the dielectric cap 1220, which is another liner, ($C_{liner}$) in series. Thus:

$$\frac{1}{C_{total}} = \frac{1}{C_{air}} + \frac{2}{C_{liner}} \qquad [\text{EQ. 1}]$$

As EQ. 1 indicates, the total capacitance is dominated by the capacitance of the air spacer. As such, even a narrow air gap 1225 can result in a significant reduction in parasitic capacitance relative to a spacer without an air gap 1225. For example, if the total spacer width for the liner 710 and air spacer 1210 is 6 nm, even a 1.5 nm wide air gap 1225 results in a 50 percent reduction in the capacitance between the gate 445 and SAC 910 as compared with not having the air gap 1225.

Figure 14:
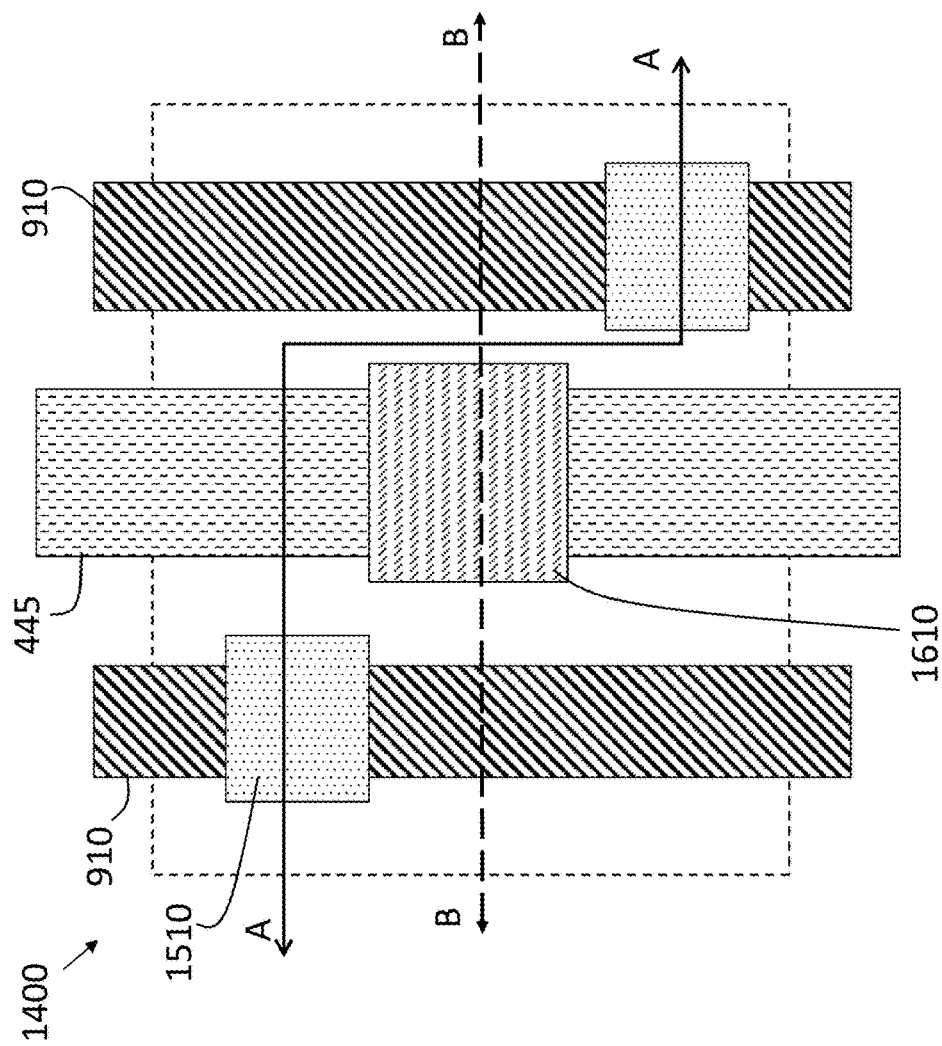
FIG. 14 is an overhead view of aspects of a semiconductor device with air spacers according to one or more embodiments of the invention.
Figure 15:
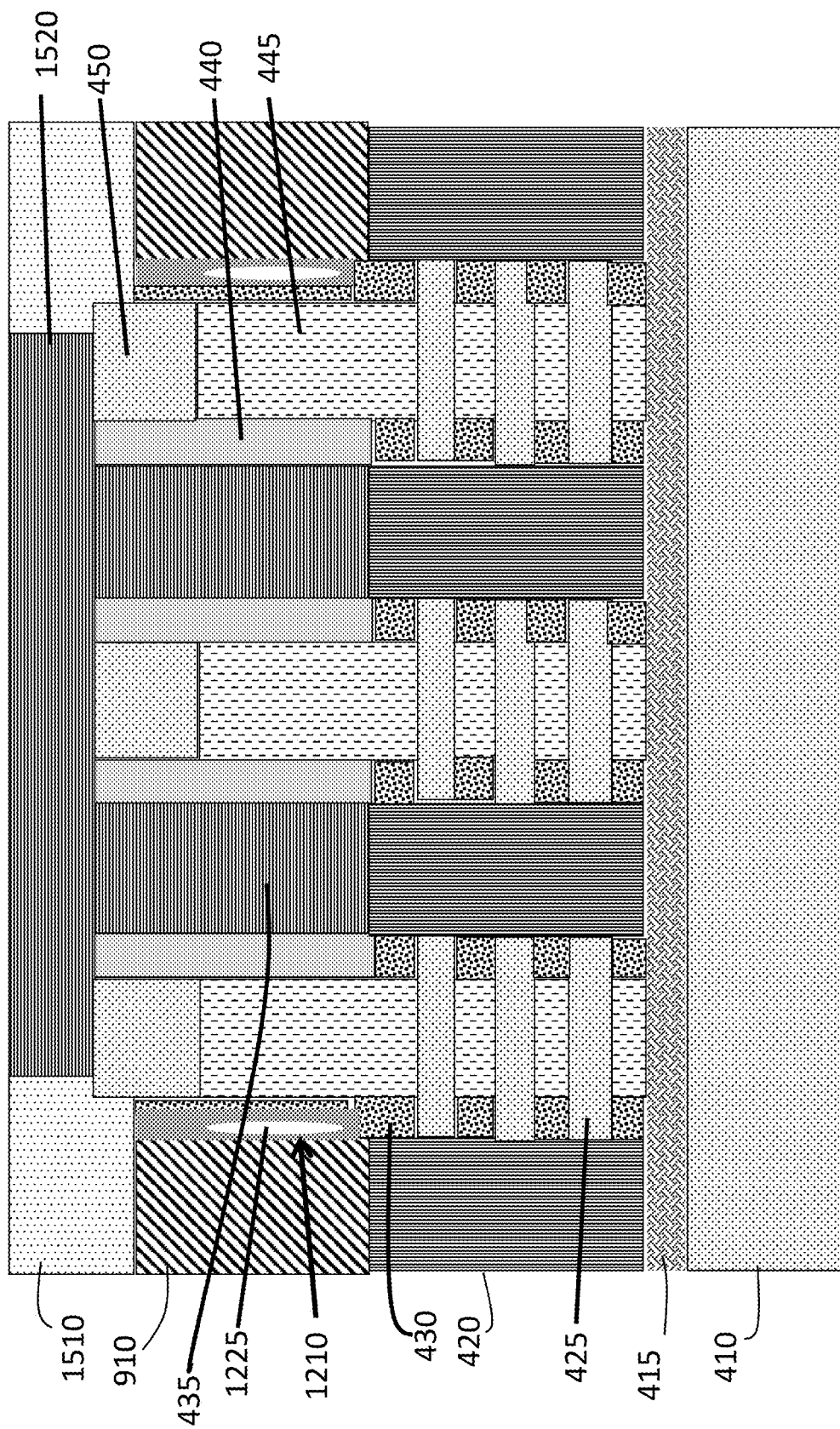
FIG. 15 is a cross-sectional view through vias of the device shown in FIG. 14.
Figure 16:
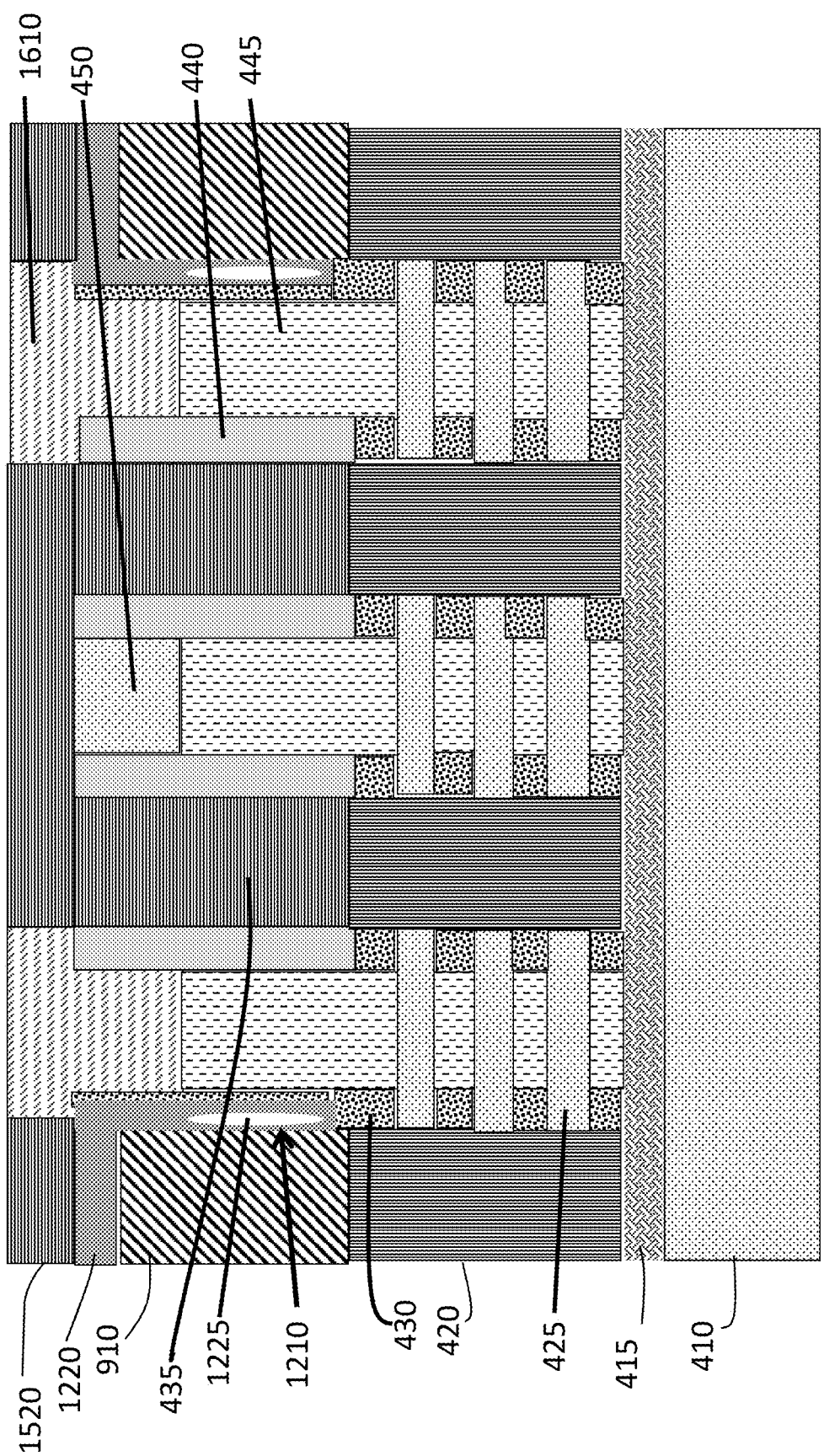
FIG. 16 is a cross-sectional view through a gate contact of the device shown in FIG. 14.

FIG. 14 is an overhead view of aspects of a semiconductor device 1400 with air spacers 1220 according to one or more embodiments of the invention. The exemplary semiconductor device 1400 results from additional processing of the structure 1200 shown in FIG. 12. One gate 445 is shown with a gate contact 1610, which is detailed in FIG. 16, and two SACs 910 are shown with vias 1510, which are another set of self-aligned contacts, as shown in FIG. 15. FIGS. 15 and 16 show two different cross-sectional views of the semiconductor device 1400.

FIG. 15 shows a cross-sectional view of the semiconductor device 1400 along A-A, as indicated in FIG. 14. As FIG. 15 indicates, vias 1510 are formed above the SACs 910. An ILD 1520, which can be the same material as the ILD layers 435, is deposited and patterned to form trenches that are then filled with a conductor to form vias 1510. A CMP process can be performed after filling the trenches with the conductor. As a result of the patterning and CMP process, the ILD 1520 remains only above the SAC caps 450 and ILD layers 435, as shown. Because the materials of the dielectric cap 1220 on top of SAC 910 and the SAC cap 450 on top of gate 445 are different, vias 1510 can be formed by etching through the ILD 1520 and the dielectric cap 1220, selective to the SAC cap 450 on top of gate 445. Self-aligned vias 1510 to the SAC 910 can be formed without electrically shorting the via to the gate 445, even when the via lands on top of the SAC cap 450.

FIG. 16 shows a cross-sectional view of the semiconductor device 1400 along B-B, as indicated in FIG. 14. As FIG.

16 indicates, gate contacts 1610 are formed above only the gates 445 that are adjacent to SACs 910. The gate 445 (i.e., the center gate in the exemplary structure shown in FIG. 16) adjacent to shared source and drain regions 420 does not have a gate contact 1610 formed above it. The gate contacts 1610 are formed by depositing the ILD 1520 and patterning the ILD 1520 and SAC caps 450 above the two end gates 445 to form trenches that are filled with a conductor. Because the materials of the dielectric cap 1220 on top of SAC 910 and the SAC cap 450 on top of the gate 445 are different, the gate contact 1610 can be formed by etching through the ILD 1520 and the SAC cap 450, selective to the dielectric cap 1220 on top of the SAC 910. The self-aligned gate contact 1610 can be formed on top of the active transistor without electrically shorting the gate contact 1610 to the SAC 910, even if the gate contact trench lands on top of the dielectric cap 1220.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
   forming a series of two or more gates;
   forming a gate spacer on each side of each gate of the series of two or more gates;
   forming a source region on a side of each of the two or more gates and forming a drain region on an opposite side of each of the two or more gates, wherein the source region or the drain region between two adjacent ones of the two or more gates is shared by the two adjacent ones of the two or more gates and only the source region or the drain region on one side of a first gate in the series of two or more gates and the source region or the drain region on one side of a last gate in the series of two or more gates are unshared source or drain regions;
   depositing an interlayer dielectric (ILD) layer above each of the source regions and each of the drain regions;
   removing the ILD layer above the unshared source or drain regions;
   removing the gate spacer on the one side of the first gate in the series of two or more gates and removing the gate spacer on the one side of the last gate in the series of two or more gates;
   forming a self-aligned contact (SAC) on the unshared source or drain regions while retaining the ILD layer above all other ones of the source regions and the drain regions; and
   forming an air spacer between the SAC on the one side of the first gate and the first gate and between the SAC on the one side of the last gate and the last gate.

2. The method according to claim 1 further comprising conformally depositing a liner and a sacrificial material, wherein the liner and the sacrificial material are deposited in locations where the gate spacer on the one side of the first gate and the gate spacer on the one side of the last gate were removed.

3. The method according to claim 2 further comprising removing the sacrificial material between the SAC and the one side of the first gate and the sacrificial material between the SAC and the one side of the last gate while leaving the liner and an air gap.

4. The method according to claim 3 further comprising pinching off the air gap with a dielectric material, wherein the air gap and the dielectric material on the one side of the first gate and on the one side of the last gate define the air spacers.

5. The method according to claim 1, wherein the semiconductor device includes nanosheet field effect transistors (FETs) and the forming the series of two or more gates includes forming each gate of the series of two or more gates in a gate-all-around configuration such that the gate surrounds a set of nanosheets.

6. The method according to claim 5 further comprising separating nanosheets of each of the set of nanosheets with inner spacers.

7. The method according to claim 5 further comprising forming the set of nanosheets associated with each gate of the series of two or more gates above a dielectric layer that is formed on a substrate.

8. The method according to claim 1 further comprising forming a cap above each gate of the series of two or more gates.

9. The method according to claim 8 further comprising replacing the cap above the first gate and the last gate in the series of two or more gates with a gate contact.

10. The method according to claim 1 further comprising forming a via above the SACs.

11. A semiconductor device, comprising:
a series of two or more gates;
a source region on a side of each of the two or more gates and a drain region on an opposite side of each of the two or more gates, wherein the source region or the drain region between two adjacent ones of the two or more gates is shared by the two adjacent ones of the two or more gates and only the source region or the drain region on one side of a first gate in the series of two or more gates and the source region or the drain region on one side of a last gate in the series of two or more gates are unshared source or drain regions;
a gate spacer on each side of each gate of the series of two or more gates except the one side of the first gate and the one side of the last gate in the series of two or more gates;
a self-aligned contact (SAC) on each of the unshared source or drain regions;
an interlayer dielectric (ILD) layer on each of the source regions and the drain regions that are shared by two gates of the series of two or more gates; and
an air spacer between the SAC on the one side of the first gate and the first gate and between the SAC on the one side of the last gate and the last gate.

12. The device according to claim 11 further comprising a liner between the air spacer and the one side of the first gate and between the air spacer and the one side of the last gate.

13. The device according to claim 11, wherein the air spacer is comprised of an air gap and a dielectric material.

14. The device according to claim 13, wherein the dielectric is also formed above each of the SACs.

15. The device according to claim 11, wherein the device includes nanosheet field effect transistors (FETs) and each gate of the series of two or more gates is in a gate-all-around configuration such that the gate surrounds a set of nanosheets.

16. The device according to claim 15 further comprising inner spacers that separate adjacent nanosheets of each set of nanosheets.

17. The device according to claim 15, wherein the set of nanosheets associated with each gate of the series of two or more gates is formed above a dielectric layer that is formed on a substrate.

18. The device according to claim 11 further comprising a gate contact on the first gate and the last gate in the series of two or more gates.

19. The device according to claim 11 further comprising a cap layer on every gate except the first gate and the last gate in the series of two or more gates.

20. The device according to claim 11 further comprising a via on each of the SACs.

* * * * *